United States Patent
Chen et al.

(10) Patent No.: US 8,885,428 B2
(45) Date of Patent: Nov. 11, 2014

(54) SMART READ SCHEME FOR MEMORY ARRAY SENSING

(71) Applicant: Sandisk 3D LLC, Milpitas, CA (US)

(72) Inventors: Yingchang Chen, Cupertino, CA (US); Jeffrey Koon Yee Lee, Fremont, CA (US)

(73) Assignee: Sandisk 3D LLC, Milpitas, CA (US)

( * ) Notice: Subject to any disclaimer, the term of this patent is extended or adjusted under 35 U.S.C. 154(b) by 112 days.

(21) Appl. No.: 13/773,963

(22) Filed: Feb. 22, 2013

(65) Prior Publication Data

US 2014/0241090 A1 Aug. 28, 2014

(51) Int. Cl.
*G11C 7/06* (2006.01)
*G11C 13/00* (2006.01)
*G11C 16/26* (2006.01)

(52) U.S. Cl.
CPC ........... *G11C 7/06* (2013.01); *G11C 13/004* (2013.01); *G11C 16/26* (2013.01)
USPC ........... 365/207; 365/148; 365/158; 365/163; 365/185.21; 365/189.07; 365/189.15

(58) Field of Classification Search
CPC ........... G11C 7/06; G11C 7/062; G11C 7/12; G11C 11/1673; G11C 11/2273; G11C 11/4091; G11C 13/004; G11C 16/26; G11C 16/28
USPC ......... 365/207, 148, 158, 163, 185.2, 185.21, 365/189.07, 189.15
See application file for complete search history.

(56) References Cited

U.S. PATENT DOCUMENTS

| | | | |
|---|---|---|---|
| 6,574,145 B2 | 6/2003 | Kleveland | |
| 6,912,150 B2 * | 6/2005 | Portman et al. | 365/149 |
| 7,362,604 B2 | 4/2008 | Scheuerlein | |
| 7,426,128 B2 | 9/2008 | Scheuerlein | |
| 7,551,477 B2 | 6/2009 | Mokhlesi | |
| 7,590,002 B2 | 9/2009 | Mokhlesi | |
| 7,596,035 B2 | 9/2009 | Doyle | |
| 7,733,685 B2 | 6/2010 | Scheuerlein | |
| 7,885,101 B2 * | 2/2011 | Bedeschi et al. | 365/163 |
| 7,999,529 B2 | 8/2011 | Thorp | |
| 8,111,539 B2 | 2/2012 | Fasoli | |
| 8,194,472 B2 | 6/2012 | Sato | |

(Continued)

OTHER PUBLICATIONS

U.S. Appl. No. 13/755,894, filed Jan. 31, 2013.

(Continued)

*Primary Examiner* — Tan T. Nguyen
(74) *Attorney, Agent, or Firm* — Vierra Magen Marcus LLP

(57) ABSTRACT

Methods for reducing variability in bias voltages applied to a plurality of memory cells during a sensing operation caused by IR drops along a word line shared by the plurality of memory cells are described. In some embodiments, IR drops along a shared word line may be reduced by reducing sensing currents associated with memory cells whose state has already been determined during a sensing operation. In one example, once a sense amplifier detects that a memory cell being sensed is in a particular state, then the sense amplifier may disable sensing of the memory cell and discharge a corresponding bit line associated with the memory cell. In some cases, a bit line voltage associated with a memory cell whose state has not already been determined during a first phase of a sensing operation may be increased during a second phase of the sensing operation.

20 Claims, 20 Drawing Sheets

(56) References Cited

U.S. PATENT DOCUMENTS

| | | |
|---|---|---|
| 8,238,174 B2 | 8/2012 | Yan |
| 8,593,876 B2 * | 11/2013 | Moschiano et al. ..... 365/185.21 |
| 2010/0085794 A1 | 4/2010 | Chen |
| 2010/0141335 A1 | 6/2010 | Bedeschi |
| 2010/0165712 A1 | 7/2010 | Bedeschi |
| 2010/0259961 A1 | 10/2010 | Fasoli |
| 2011/0075468 A1 | 3/2011 | Scheuerlein |
| 2011/0128808 A1 * | 6/2011 | Redman-White ............. 365/207 |
| 2012/0218807 A1 | 8/2012 | Johnson |
| 2013/0194856 A1 * | 8/2013 | Forejt et al. ................... 365/104 |

OTHER PUBLICATIONS

U.S. Appl. No. 13/354,796, filed Jan. 20, 2012.
International Search Report and Written Opinion of the International Searching Authority dated May 14, 2014, PCT Patent Application No. PCT/US2014/017252.

* cited by examiner

SMART READ SCHEME FOR MEMORY ARRAY SENSING

BACKGROUND

Semiconductor memory is widely used in various electronic devices such as cellular telephones, digital cameras, personal digital assistants, mobile computing devices, and non-mobile computing devices. A non-volatile memory device (e.g., a flash memory device) allows information to be stored and retained even when the non-volatile memory device is not connected to a source of power (e.g., a battery). Non-volatile memory devices typically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates. In recent years, non-volatile memory devices have been scaled in order to reduce cost per bit. However, as process geometries shrink, many design and process challenges are presented. These challenges include increased variability in memory cell I-V characteristics and increased word line and bit line resistance.

DETAILED DESCRIPTION

Figure 1A:
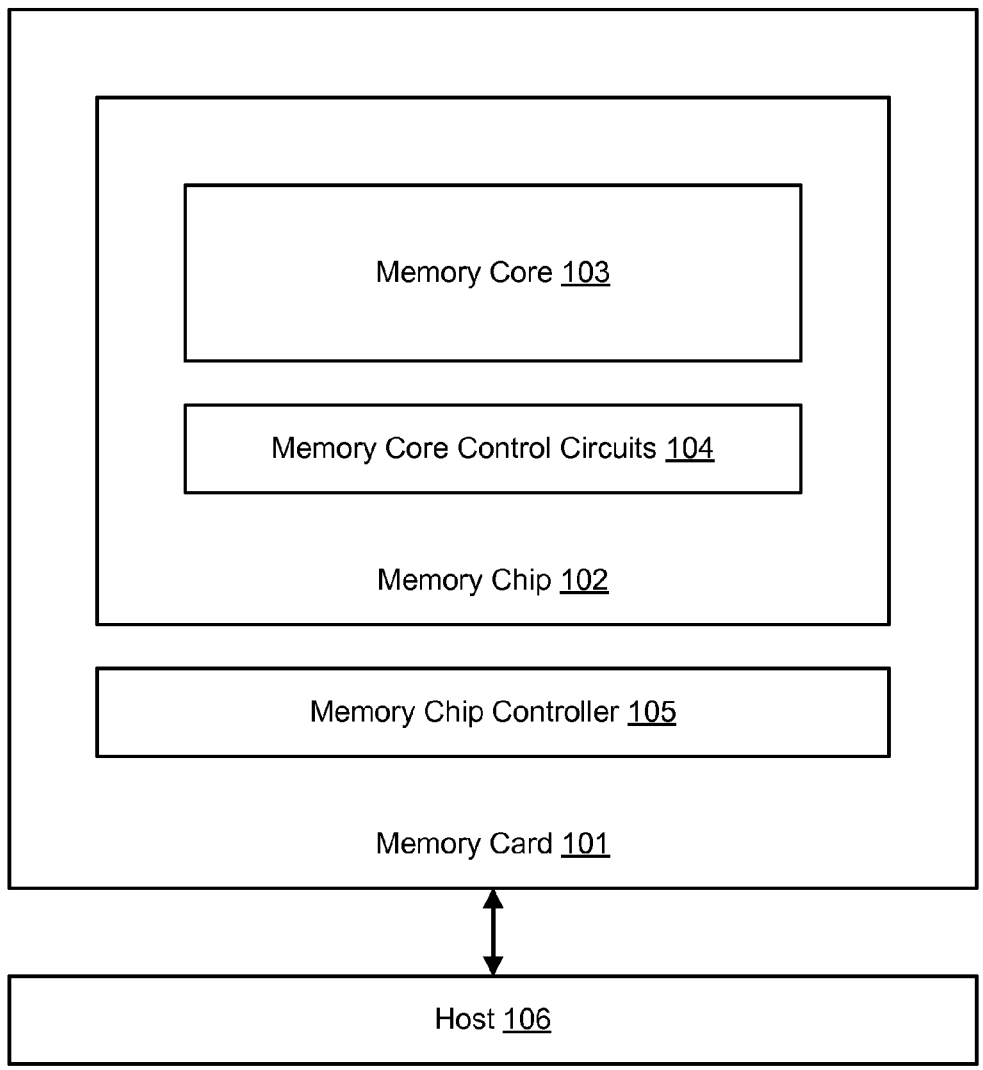
FIG. 1A depicts one embodiment of a memory system.

Technology is described for reducing variability in bias voltages applied to a plurality of memory cells during a sensing operation caused by IR drops along a word line shared by the plurality of memory cells. In some embodiments, IR drops along a shared word line may be reduced by reducing (or eliminating) sensing currents associated with memory cells whose state has already been determined during a sensing operation. In one example, once a sense amplifier detects that a memory cell being sensed is in a particular state (e.g., that the memory cell conducts more than a reference current), then the sense amplifier may disable sensing of the memory cell and discharge a corresponding bit line associated with the memory cell or bias the corresponding bit line to a lower voltage that reduces the current through the memory cell. In some cases, a bit line voltage associated with a memory cell whose state has not already been determined during a first phase of a sensing operation may be increased during a second phase of the sensing operation. The second phase of the sensing operation may begin after a particular period of time has passed or after a number of sense amplifiers have been disabled (or locked out). The second phase of the sensing operation may be performed after the sensing currents associated with a number of strongly conducting memory cells have been significantly reduced or eliminated.

In some embodiments, during a read operation, a plurality of memory cells sharing a common word line may be continuously sensed using a plurality of memory cell sensing circuits. Once a memory cell sensing circuit of the plurality of memory cell sensing circuits determines a state of a corresponding memory cell of the plurality of memory cells, the memory cell sensing circuit may "lock-out" and cause the voltage applied to the memory cell to be reduced (e.g., a corresponding bit line may be actively discharged or set to an unselected bit line voltage) to reduce IR drops associated with the common word line. The continuous sensing and asynchronous locking-out of memory cell sensing circuits associated with memory cells whose states have been determined reduces undesirable IR drops along the common word line over time during the read operation. In one example, during a read sensing time of 100 ns, after 10 ns a first memory cell sensing circuit associated with a "strong" ON memory cell may lock-out and then asynchronously after 30 ns a second memory cell sensing circuit associated with a second "strong" ON memory cell may lock-out. In some embodiments, after a first phase of a read operation (e.g., after 100 ns), all memory cell sensing circuits associated with "strong" ON memory cells may be locked-out. During a second phase of the read operation, as sensing currents through the "strong" ON memory cells will no longer contribute to IR drops along the common word line, the voltage on bit lines associated with memory cells whose states have not been determined may be increased.

In some cases, a semiconductor memory array may include a cross-point memory array. A cross-point memory array comprises a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a phase change material. Each memory cell in a cross-point memory array may be placed in series with a steering element, such as a diode, in order to reduce leakage currents associated with unselected memory cells. One issue involving the sensing of memory cells in a cross-point memory array is that the IR drop along a common word line shared by a plurality of memory cells being sensed at the same time may cause the bias voltages placed across the plurality of memory cells to be different (e.g., a first voltage across a first memory cell at a near end of a word line may be larger than a second voltage across a second memory cell at a far end of the word line). Moreover, the bias voltage placed across each of the plurality of memory cells may be data dependent (i.e., the IR drop along the common word line may be a function of the data states of the memory cells). As these variations in bias voltage may impact memory performance and reliability, there is a need to reduce IR drops along a word line shared by a plurality of memory cells during sensing of the plurality of memory cells (e.g., during a read operation).

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102. The memory chip controller 105 may include one or more state machines, page registers, SRAM, or other control logic for controlling the operation of memory chip 102. The one or more state machines, page registers, SRAM, and/or other control logic for controlling the operation of the memory chip may be referred to as managing or control circuits for facilitating one or more memory array operations including erasing, programming, or reading operations. The memory chip controller may receive data and commands from host 106 and provides memory chip data to host 106.

In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

Figure 1B:
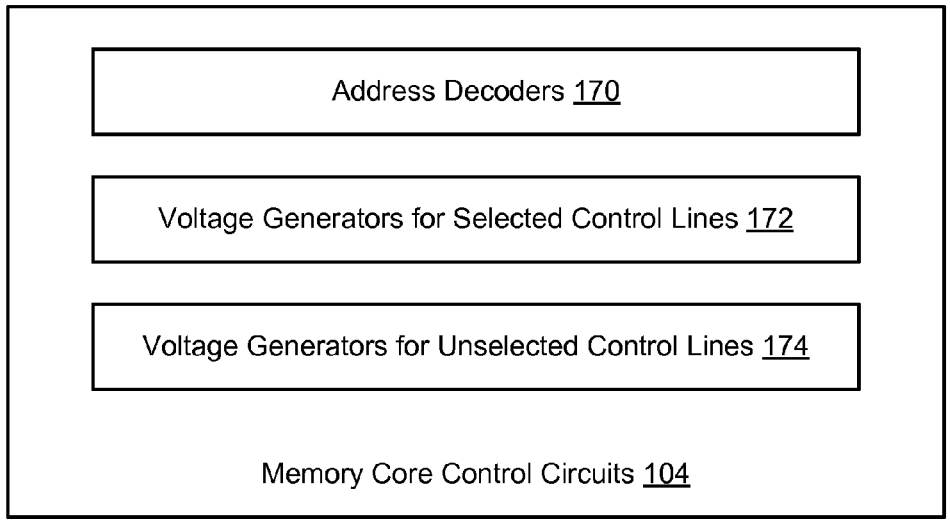
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
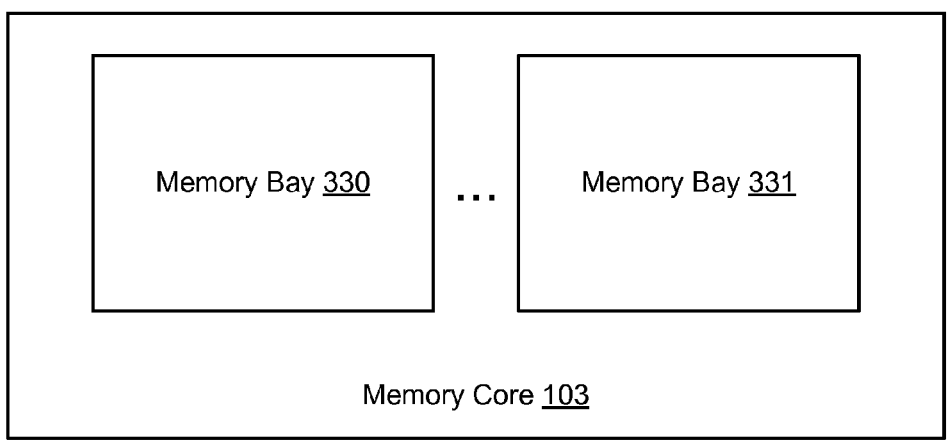
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
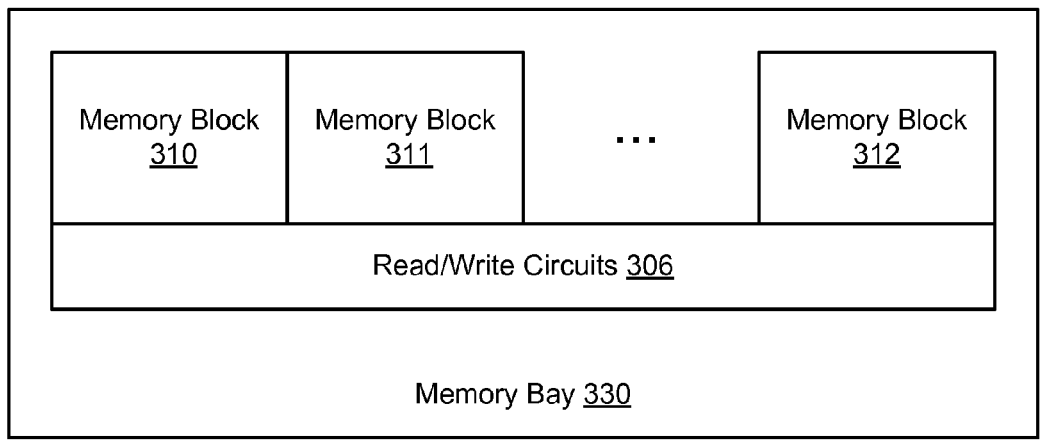
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block should be electrically coupled to read/write circuits 306 at a particular time to avoid signal conflicts.

Figure 1E:
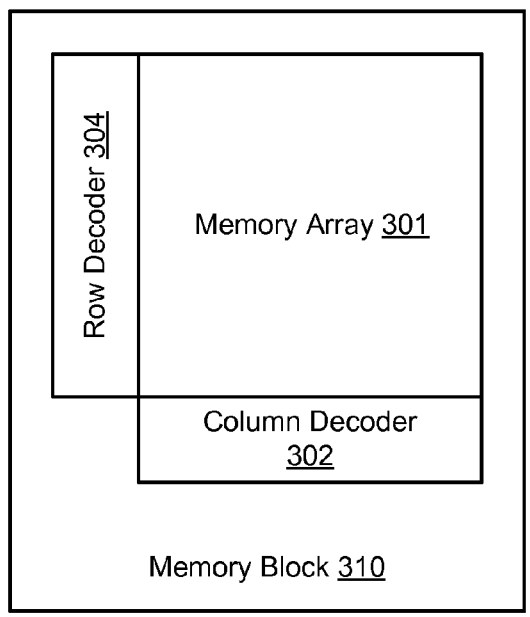
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells (i.e., memory array 310 may comprise a two-dimensional memory array or a three-dimensional memory array). The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
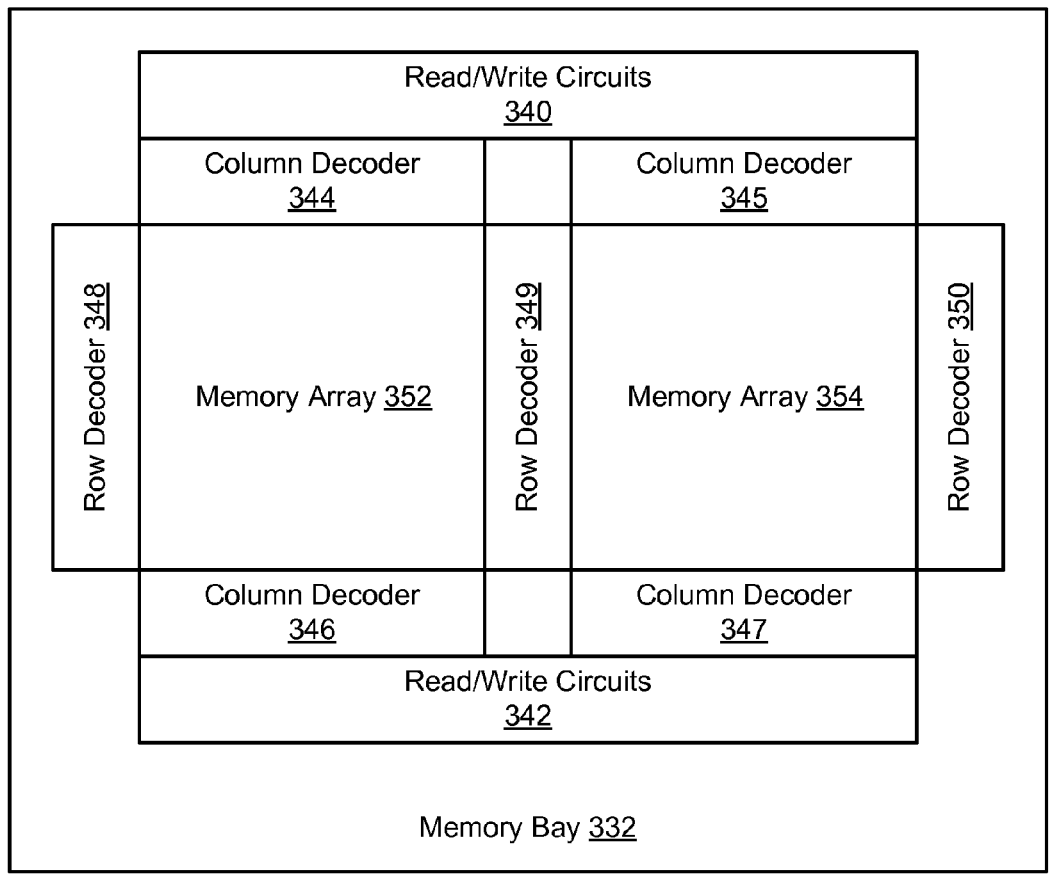
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split allows for a more efficient layout of the memory bay.

Figure 2A:
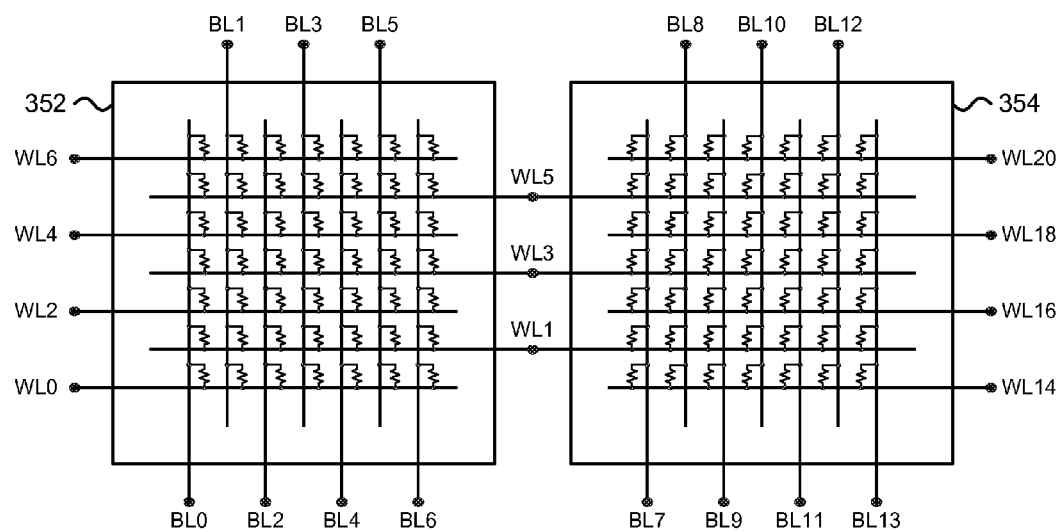
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical to the supporting substrate (i.e., the vertical plane is perpendicular to the supporting substrate).

Figure 2B:
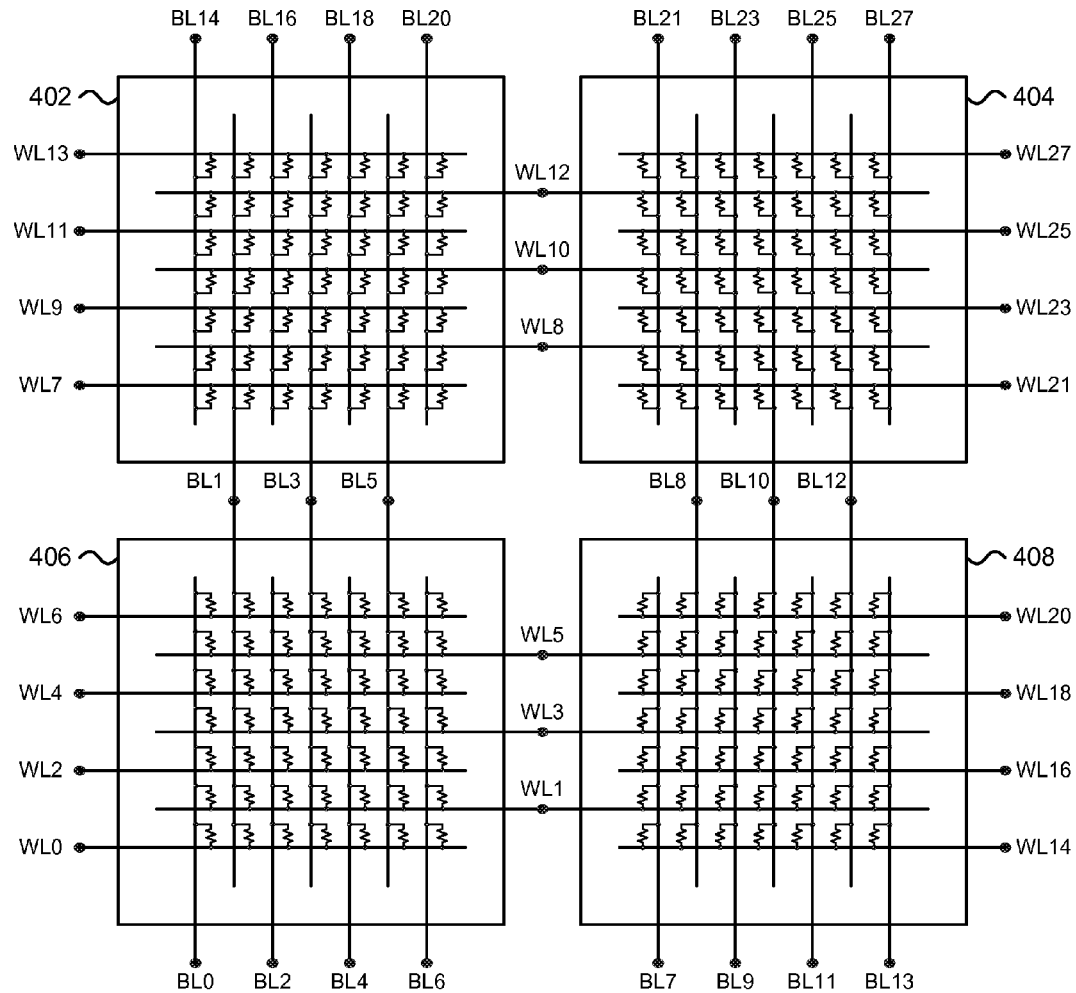
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
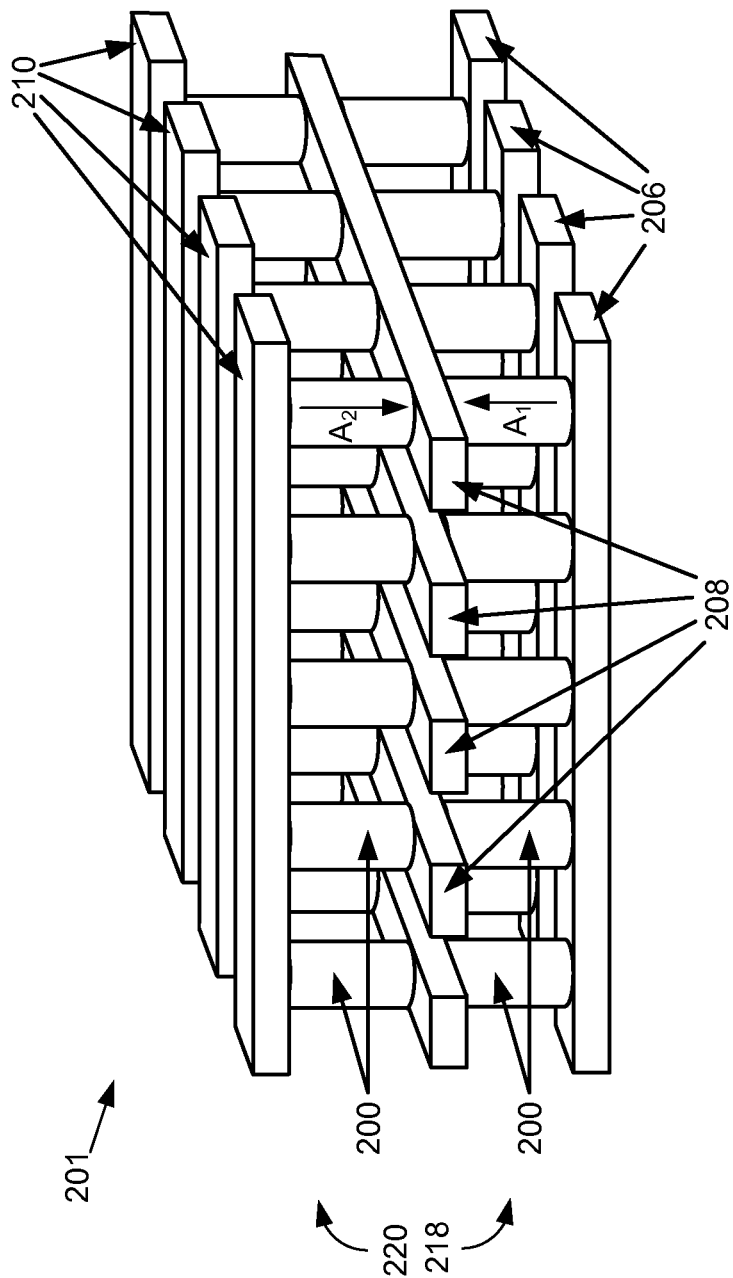
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode from a memory cell may reduce the process complexity and costs associated with manufacturing a memory array.

In one embodiment, the memory cells 200 of FIG. 3A include re-writable non-volatile memory cells. In one example, U.S. Patent Application Publication No. 2006/0250836, which is herein incorporated by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In one embodiment, the reversible resistance-switching material may include a metal oxide. The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to the selected word line voltage in read mode (e.g., 0.4V). A read circuit is then used to bias a selected bit line connected to the selected memory cell to the selected bit line voltage in read mode (e.g., 0V). In some cases, in order to avoid sensing leakage current from the many unselected word lines to the selected bit line, the unselected word lines may be biased to the same voltage as the selected bit lines (e.g., 0V). To avoid leakage current from the selected word line to the unselected bit lines, the unselected bit lines may be biased to the same voltage as the selected word line (e.g., 0.4V); however, biasing the unselected word lines to the same voltage as the selected bit lines and biasing the unselected bit lines to the same voltage as the selected word line will place a large voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. Leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation is similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET requires a higher than normal voltage and is referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
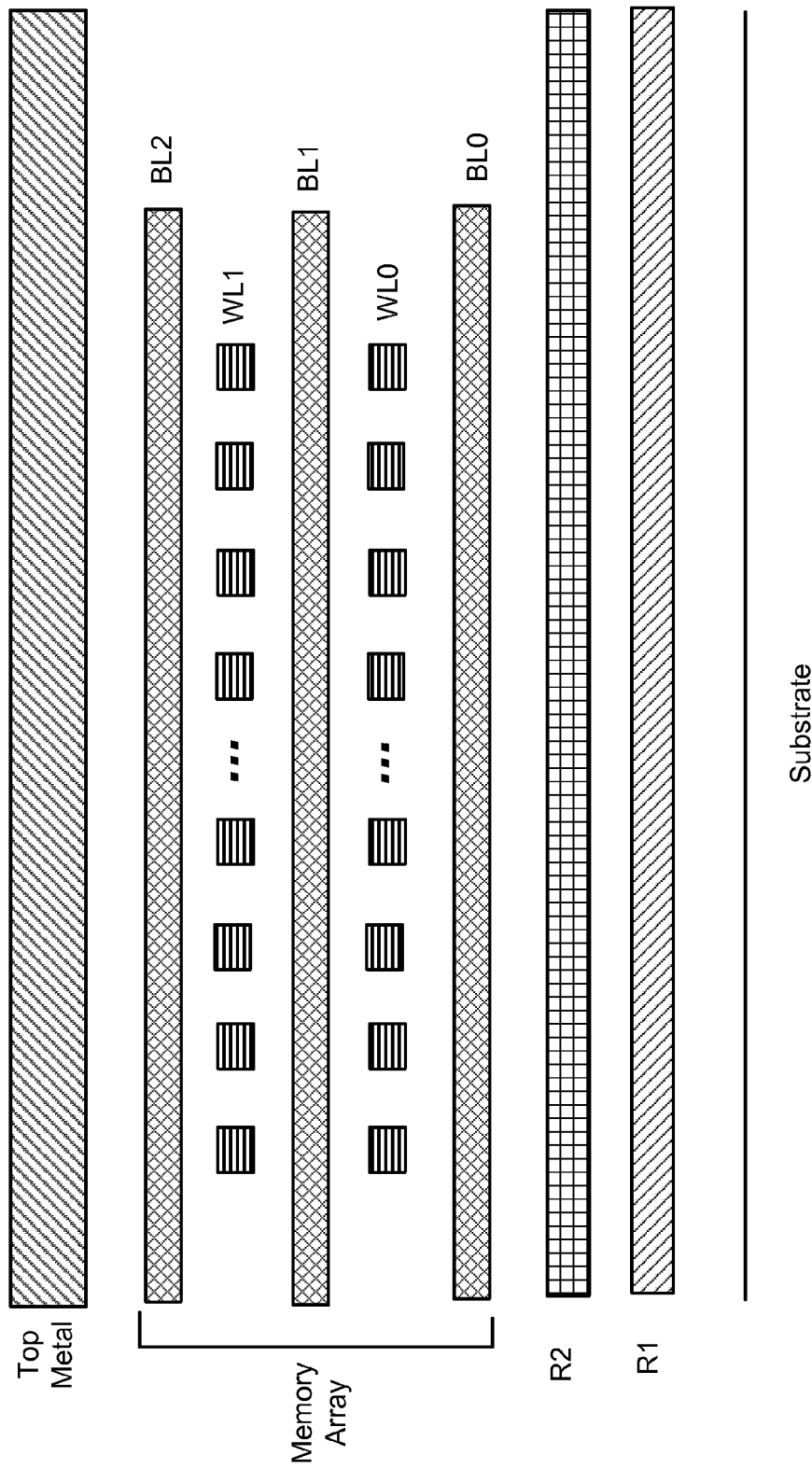
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit such as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 must be able to withstand the processing steps for fabricating the Memory Array layers on top of R1 and R2.

Figure 4:
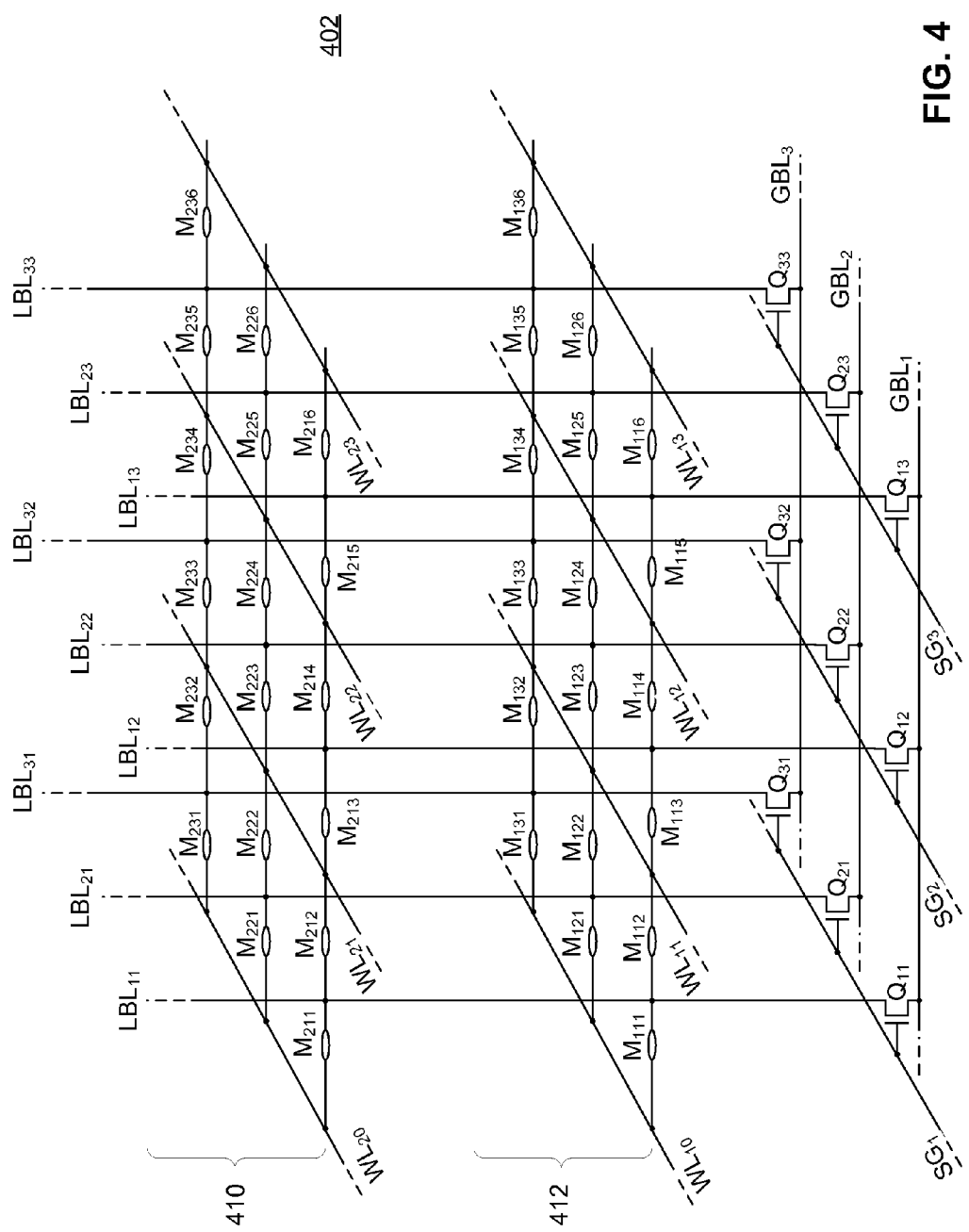
FIG. 4 depicts one embodiment of a portion of a monolithic three-dimensional memory array.

FIG. 4 depicts one embodiment of a portion of a monolithic three-dimensional memory array 402 that includes a first memory level 412 positioned below a second memory level 410. Memory array 402 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 402, includes a greater number of memory cells along the word lines as compared with the number of memory cells along the bit lines. For example, the number memory cells along each bit line may be 16, while the number of memory cells along each word line may be 2048. More information regarding the structure and operation of vertical bit line memory arrays can be found in U.S. Provisional Application 61/423,007, "Non-Volatile Memory Having 3D Array of Read/Write Elements With Vertical Bit Lines and Laterally Aligned Active Elements and Methods Thereof" and U.S. patent application Ser. No. 13/323,703, "Three Dimensional Non-Volatile Storage with Three Device Driver for Row Select," both of which are herein incorporated by reference in their entirety.

Figure 5:
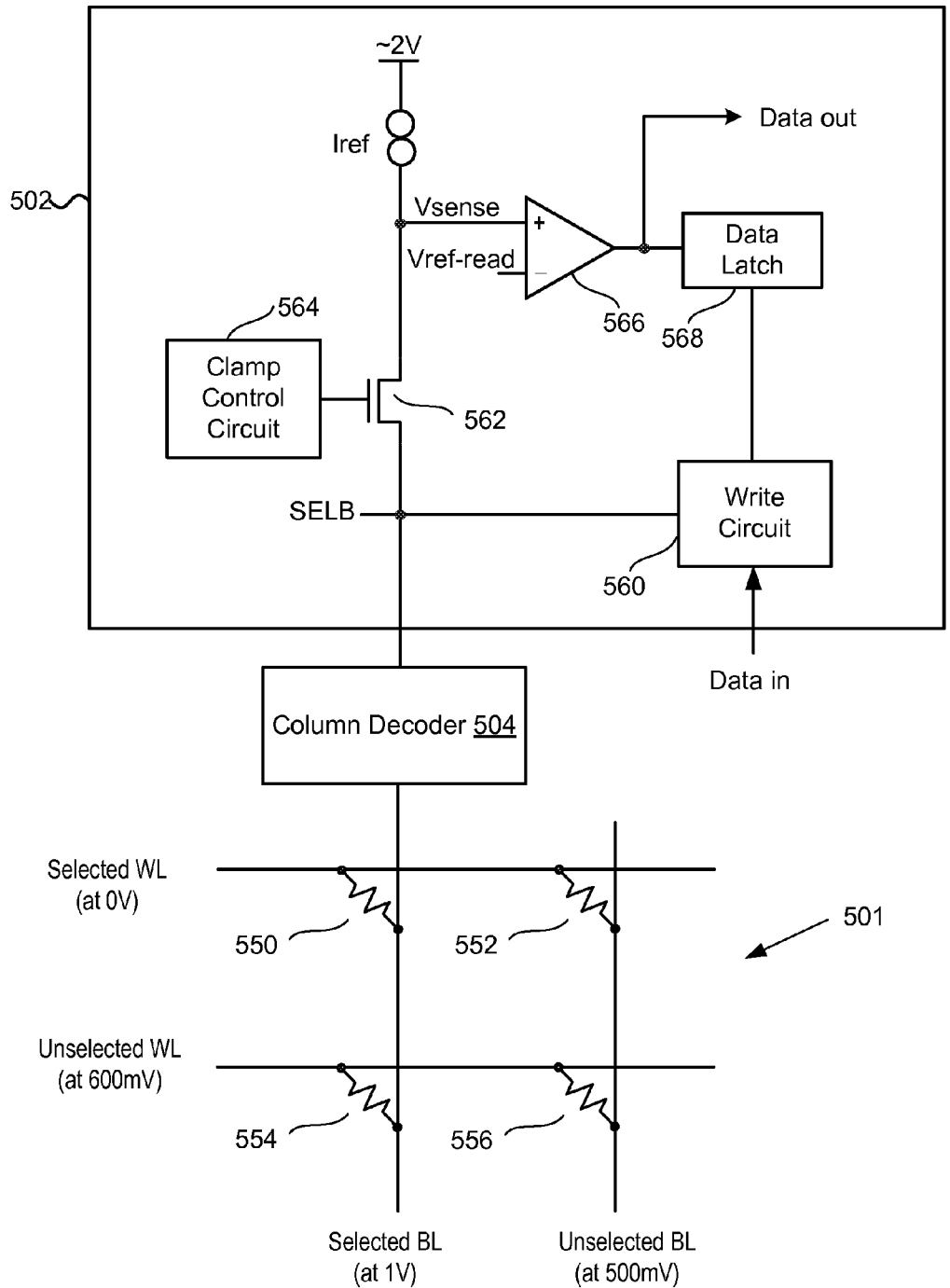
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 402 in FIG. 4. As depicted, the selected bit line is biased to 1V, the unselected word line is biased to 0.6V, the selected word line is biased to 0V, and the unselected bit line is biased to 0.5V.

In some embodiments, the selected bit line may be biased to 2.0V, the unselected word line may be biased to 2.0V, the selected word line may be biased to 0V, and the unselected bit line may be biased to 0V. In other embodiments, the memory array biasing scheme of FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 is electrically coupled to the selected bit line via column decoder 504. In one embodiment, column decoder 504 may correspond with column decoder 302 depicted in FIG. 1E. Transistor 562 couples node SELB to the Vsense node. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the data in terminal, and data latch 568.

During a read operation, read/write circuit 502 biases the selected bit line to the selected bit line voltage in read mode. Prior to sensing data, read/write circuit 502 will precharge the Vsense node to 2V. When sensing data, read/write circuit 502 attempts to regulate the SELB node to 1V via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 will latch the output of sense amplifier 566 after a time period of sensing the current through the selected memory cell (e.g., 400 ns).

In one embodiment, during a write operation, if the data in terminal requests a data "0" to be written to a selected memory cell, then read/write circuit 502 biases SELB to the selected bit line voltage in write mode (e.g., 1.2V for a SET operation) via write circuit 560. The duration of programming the memory cell can be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell," incorporated herein by reference in its entirety. If the data in terminal requests a data "1" to be written, then write circuit 560 may bias SELB to the unselected bit line voltage in write mode (e.g., 0V for a SET operation). The write circuit 560 may also bias SELB to a program inhibit voltage in write mode that is different from the unselected bit line voltage.

Figure 6A:
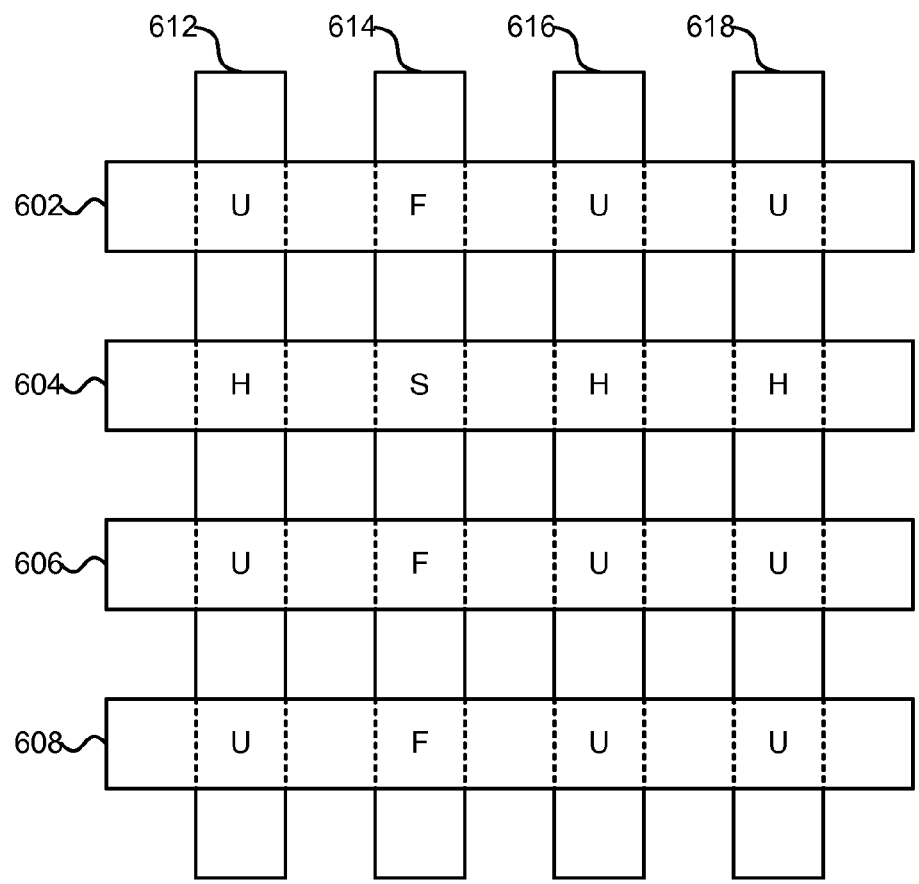
FIG. 6A depicts one embodiment of a cross-point memory array.

FIG. 6A depicts one embodiment of a cross-point memory array 610. The cross-point memory array 610 may correspond with memory array 201 in FIG. 3A or memory array 402 in FIG. 4. As depicted, cross-point memory array 610 includes word lines 602-608 and bit lines 612-618. Word line 604 comprises a selected word line and bit line 614 comprises a selected bit line. At the intersection of selected word line 604 and selected bit line 614 is a selected memory cell (an S cell). The voltage across the S cell is the difference between the selected word line voltage and the selected bit line voltage. Memory cells at the intersections of the selected word line 604 and the unselected bit lines 612, 616, and 618 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 614 and the unselected word lines 602, 606, and 608 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 602, 606, and 608 and the unselected bit lines 612, 616, and 618 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 602, may be associated with a particular page stored within the cross-point memory array 610.

Figure 6B:
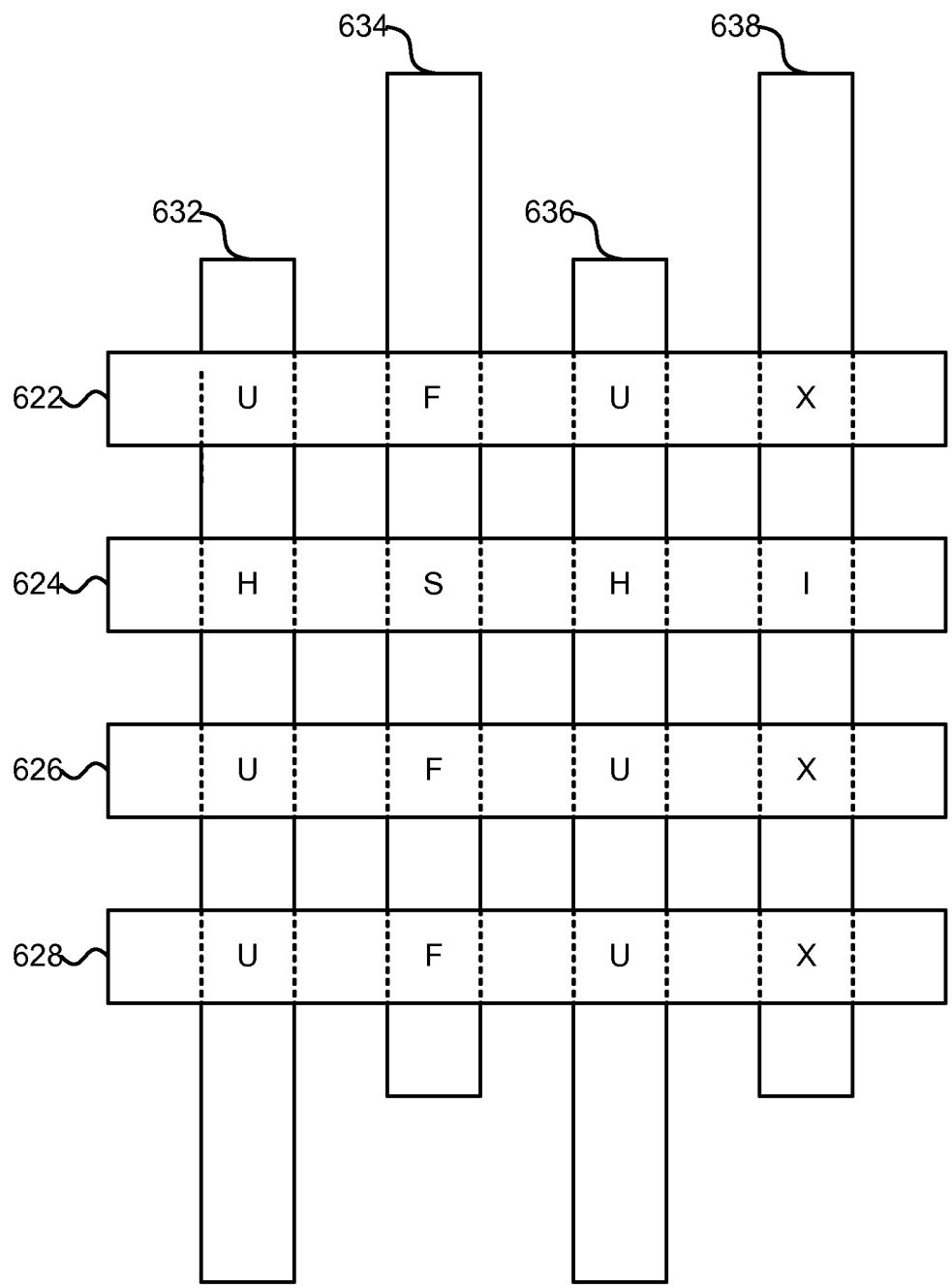
FIG. 6B depicts an alternative embodiment of a cross-point memory array.

FIG. 6B depicts an alternative embodiment of a cross-point memory array 620. The cross-point memory array 620 may correspond with memory array 201 in FIG. 3A or memory array 402 in FIG. 4. As depicted, cross-point memory array 620 includes word lines 622-628 and bit lines 632-638. Word line 624 comprises a selected word line and bit lines 634 and 638 comprise selected bit lines. Although both bit lines 634 and 638 are selected, the voltages applied to bit line 634 and bit line 638 may be different. For example, in the case that bit line 634 is associated with a first memory cell to be programmed (i.e., an S cell), then bit line 634 may be biased to a selected bit line voltage in order to program the first memory cell. In the case that bit line 638 is associated with a second memory cell that is not to be programmed (i.e., an I cell), then bit line 638 may be biased to a program inhibit voltage (i.e., to a bit line voltage that will prevent the second memory cell from being programmed).

At the intersection of selected word line 624 and selected bit line 638 is a program inhibited memory cell (an I cell). The voltage across the I cell is the difference between the selected word line voltage and the program inhibit voltage. Memory cells at the intersections of the selected bit line 638 and the unselected word lines 622, 626, and 628 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 638 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 622 may be associated with a first page and a second page. The first page may correspond with bit lines 632 and 636 and the second page may correspond with bit lines 634 and 638. In this case, the first page and the second page may correspond with interdigitated memory cells that share the same word line. When a memory array operation is being performed on the first page (e.g., a programming operation) and the selected word line 624 is biased to the selected word line voltage, one or more other pages also associated with the selected word line 624 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 620 may comprise resistive memory elements without isolating diodes. In another embodiment, a floating control line (e.g., bit line 636) comprises a portion of the memory array that may be undriven during an operation on memory cell S using a first selected control line (e.g., bit line 634). Selection devices connected to control line 636 may be turned off during the memory operation causing control line 636 to be floating. Since a portion of the memory cells connected to the control lines 634 and 636 are also connected to shared unselected second control lines 622, 626, and 628, the floating control lines will float to a voltage substantially the same as the voltage of the unselected second control lines. In one embodiment, the control lines 634 and 636 may comprise vertical bit lines in a three dimensional memory array comprising comb shaped word lines. More information regarding vertical bit line three dimensional memory arrays can be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

Figure 7A:
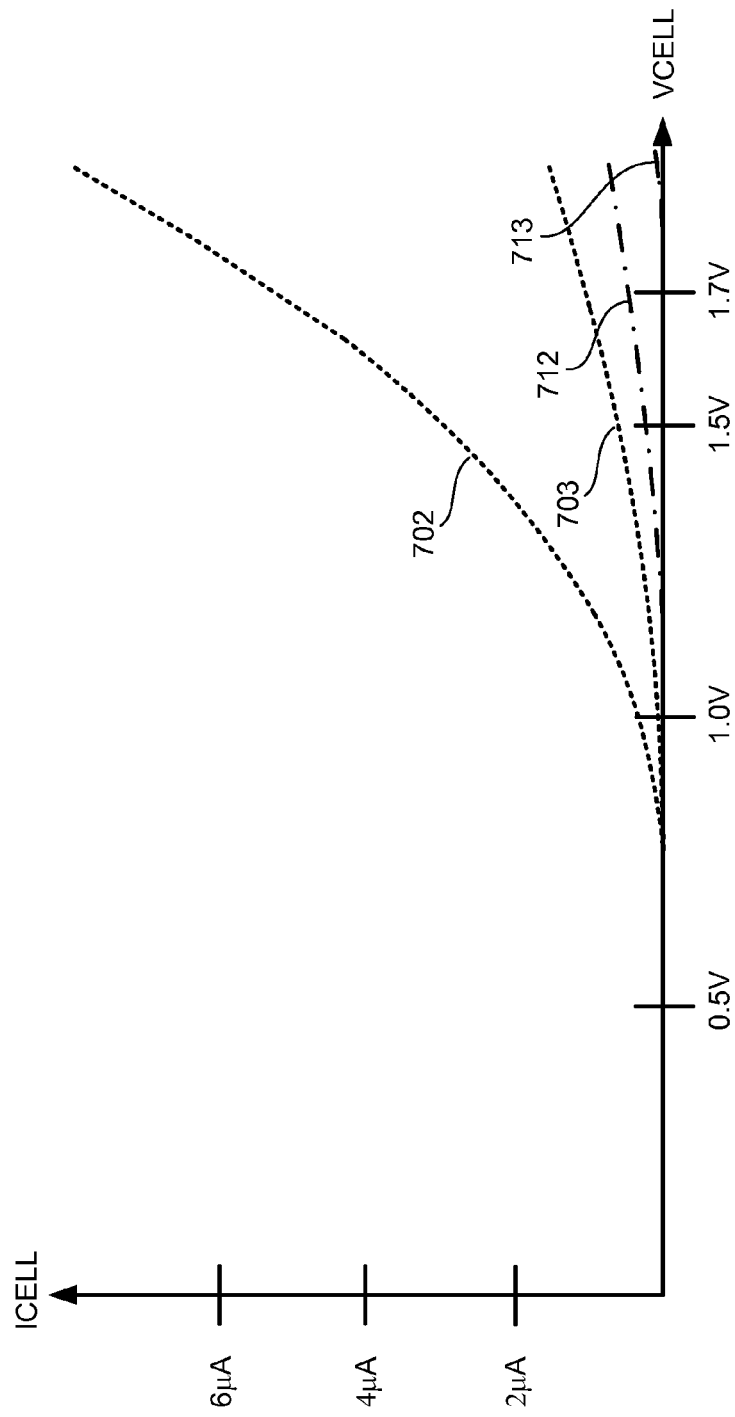
FIG. 7A depicts one embodiment of memory cell current distributions for memory cells programmed into an ON state and memory cells programmed into an OFF state over an applied memory cell voltage.

FIG. 7A depicts one embodiment of memory cell current distributions for memory cells programmed into an ON state (bounded by the lines 702-703) and memory cells programmed into an OFF state (bounded by lines 712-713) over an applied memory cell voltage (VCELL). As depicted, the memory cell current distribution for memory cells programmed into the ON state (e.g., one of the possible conducting states for a memory cell) is shown by a range bounded by lines 702-703, which comprise the boundaries of the expected variability for a given probability distribution (e.g., +/−4 sigma variation). In one example, the line 702 may correspond with memory cell I-V characteristics associated with a "strong" ON memory cell and the line 703 may correspond with memory cell I-V characteristics associated with a "weak" ON memory cell. The memory cell current distribution for memory cells programmed into the OFF state is shown by a range bounded by lines 712-713, which comprise the boundaries of the expected variability for a given probability distribution (e.g., +/−4 sigma variation). In one example, the line 712 may correspond with memory cell I-V characteristics associated with a "strong" OFF memory cell and the line 713 may correspond with memory cell I-V characteristics associated with a "weak" OFF memory cell.

As depicted, for a given VCELL (e.g., 1.7V applied across a memory cell), the output current (ICELL) associated with a "weak" ON memory cell is greater than the ICELL associated with a "strong" OFF memory cell. However, if the voltage applied across a "weak" ON memory cell is less than the voltage applied across a "strong" OFF memory cell (e.g., due to IR voltage drops along a word line), then the ICELL associated with the "weak" ON memory cell may not be greater than the ICELL associated with the "strong" OFF memory cell. For example, if the VCELL applied to a "strong" OFF memory cell is 1.7V and the VCELL applied to a "weak" ON memory cell is 1.5V, then the output currents of both cells may be roughly equal; thus, in this case, the states of the two memory cells may not be distinguishable.

Figure 7B:
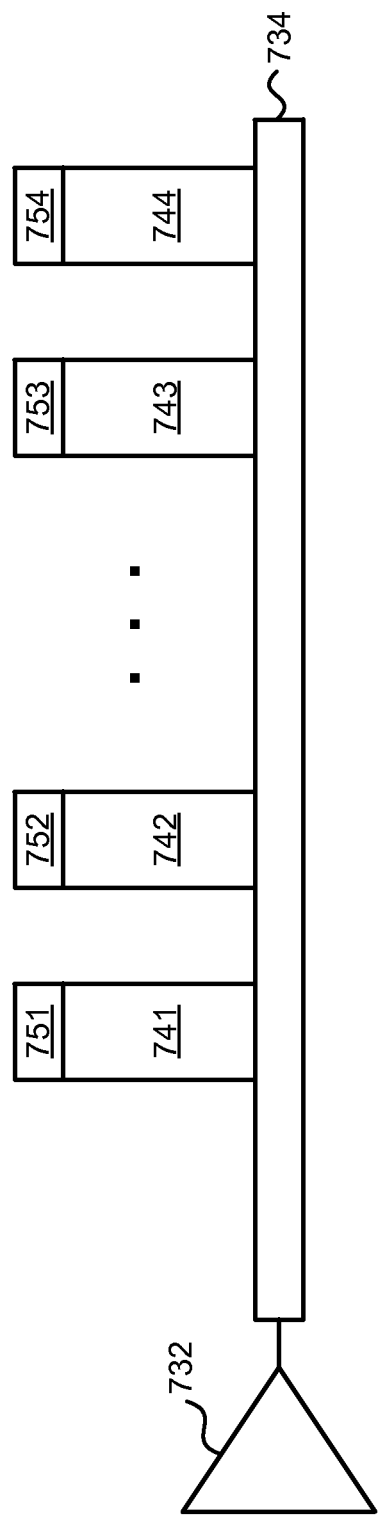
FIG. 7B depicts one embodiment of a plurality of memory cells sharing a common word line.

FIG. 7B depicts one embodiment of a plurality of memory cells sharing a common word line 734. As depicted, word line 734 is driven by a word line driver 732, which may bias the word line 734 to a selected word line voltage during a sensing operation. Each bit line of the bit lines 751-754 is connected to one of the plurality of memory cells 741-744. The plurality of memory cells 741-744 are connected to the word line 734. During a sensing operation, the word line driver 732 may bias the word line 734 to a selected word line voltage. However, due to IR drops along the word line 734, the voltage bias across the memory cell 741 may be larger than the voltage bias across memory cell 744. In one embodiment, memory cell 741 may comprise a "strong" OFF memory cell, memory cell 743 may comprise a "strong" ON memory cell, and memory cell 744 may comprise a "weak" ON memory cell. In this case, a "strong" sensing current associated with memory cell 743 may cause a voltage drop across the word line 734 that raises the voltage of the word line below memory cell 743 and reduces the voltage bias applied to memory cell 744. In some cases, the voltage drop across the word line caused by the sensing current through memory cell 743 may be reduced or eliminated by reducing the voltage applied to the bit line 753 after the state of the memory cell 743 has been determined during a sensing operation.

Figure 7C:
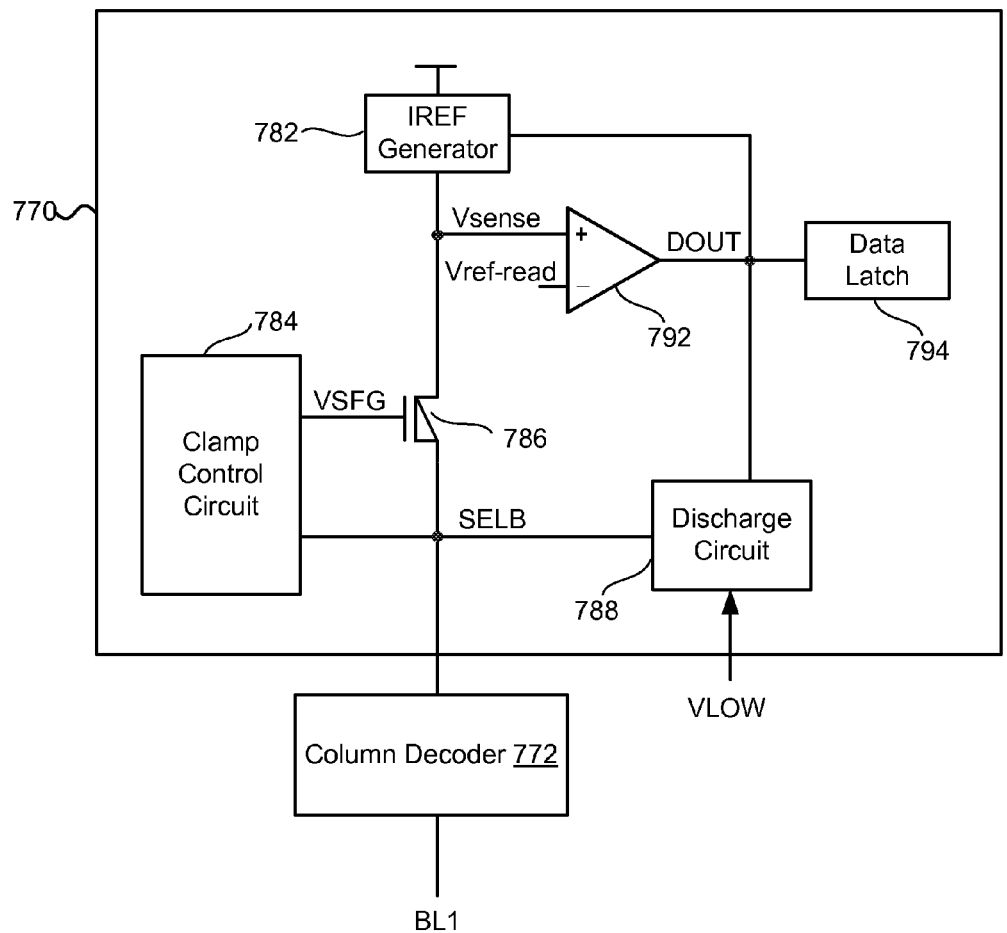
FIG. 7C depicts one embodiment of a column decoder for selecting a particular bit line and a read/write circuit for sensing a particular memory cell associated with the particular bit line during a sensing operation.

FIG. 7C depicts one embodiment of a column decoder 772 for selecting a particular bit line and a read/write circuit 770 for sensing a particular memory cell associated with the particular bit line during a sensing operation. Read/write circuit 770 is one example of an implementation of a read/write circuit included in read/write circuits 306 in FIG. 1D. In some embodiments, the capacitance associated with the SELB node (e.g., 3 pF) may be larger than the capacitance associated with the Vsense node (e.g., 100 fF) due to wiring capacitance and diffusion capacitance associated with connecting the SELB node to numerous column decoders including column decoder 772. The read/write circuit 770 may comprise a memory cell sensing circuit for determining the state of a memory cell during a sensing operation.

As depicted, the SELB node of read/write circuit 770 is electrically coupled to the selected bit line BL1 via column decoder 772 and is connected to the clamp control circuit 784, the discharge circuit 788, and the source of transistor 786. In one embodiment, column decoder 772 may correspond with column decoder 302 depicted in FIG. 1E. Transistor 786 couples node SELB to the Vsense node. Clamp control circuit 784 controls the gate of transistor 786 (via node VSFG). The transistor 786 may comprise a low VT nMOS device. The Vsense node is connected to the drain of transistor 786, IREF generator 782, which may be used to generate a reference current, and one input of sense amplifier 792. The other input of sense amplifier 792 receives Vref-read, which is the voltage level used for comparing the Vsense node voltage during a sensing operation (e.g., during a read operation). The output of sense amplifier 792 (DOUT) is connected to the IREF generator 782, the data latch 794, and the discharge circuit 788. The IREF generator 782 may comprise a current mirror for generating a memory cell reference current that may be enabled and/or disabled based on DOUT (e.g., the reference current may be disabled when DOUT falls during sensing). The discharge circuit 788 may comprise a switch for discharging the SELB node based on DOUT (e.g., the SELB node may be discharged to a particular value when DOUT falls during sensing). In one example, the discharge circuit 788 may include one or more diode connected nMOS devices for quickly discharging the SELB node to a value lower than the selected bit line voltage in read mode.

During a read operation, read/write circuit 770 biases the selected bit line BL1 to the selected bit line voltage in read mode (e.g., 2.0V). Prior to sensing data, read/write circuit 770 may precharge the Vsense node to a voltage level above the selected bit line voltage (e.g., to 4.0V). When sensing data, read/write circuit 770 attempts to regulate the SELB node to the selected bit line voltage in read mode via clamp control circuit 784 and transistor 786 in a source-follower configuration. If the current through a selected memory cell connected to the selected bit line BL1 is greater than a memory cell reference current (e.g., 500 nA) generated from IREF generator 782, then, over time, the Vsense node will fall below Vref-read (e.g., set to 3.0V) and the sense amplifier 792 will read out a data "0." Outputting a data "0" may represent that the selected memory cell is in a low resistance state (e.g., a SET state). If the current through the selected memory cell is less than the memory cell reference current, then the Vsense node will stay above Vref-read and the sense amplifier 792 will read out a data "1." Outputting a data "1" may represent that the selected memory cell is not in the low resistance state. Data latch 794 may latch the output of sense amplifier 792 after a time period of sensing the current through the selected memory cell has passed (e.g., after 400 ns).

In some embodiments, when the output of the sense amplifier 792 (DOUT) falls (or transitions from a "1" to a "0"), the reference current generated by the IREF generator 782 may be disabled and the SELB node may be discharged via discharge circuit 788. In one example, the discharge circuit 788 may discharge the SELB node to the unselected bit line voltage in read mode. In another example, the discharge circuit 788 may discharge the SELB node to a voltage lower than the selected bit line voltage during read mode. In some cases, as the capacitance on the SELB node may be relatively large and the sensing current through a memory cell may be a nonlinear function of the voltage applied to the memory cell, reducing the bit line voltage applied to the selected bit line by some amount (e.g., 500 mV) less than fully discharging the SELB node may effectively significantly reduce the sensing current associated with the sensed memory cell without having to fully discharge the SELB node or discharge the SELB node to the unselected bit line voltage.

In some embodiments, for sense amplifiers in which DOUT has not fallen during a first phase of a sensing operation, the sense amplifiers may raise the selected bit line voltage applied to the selected bit lines to increase the sensing current of "weak" ON memory cells. In order to raise the SELB node by an amount substantially equal to the raise in the selected bit line voltage without disturbing the Vsense node, the clamp control circuit 784 may charge up the SELB node to the selected bit line voltage prior to adjusting the VSFG node that drives the transistor 786 in a source-follower configuration. Otherwise, the charge on the Vsense node may be discharged in order to charge up the SELB node, which may lead to a false detection of the sensing current through a selected memory cell (i.e., the discharging of the Vsense node would be due to the charging up of the SELB node and not due to the sensing current through a selected memory cell).

Figure 8A:
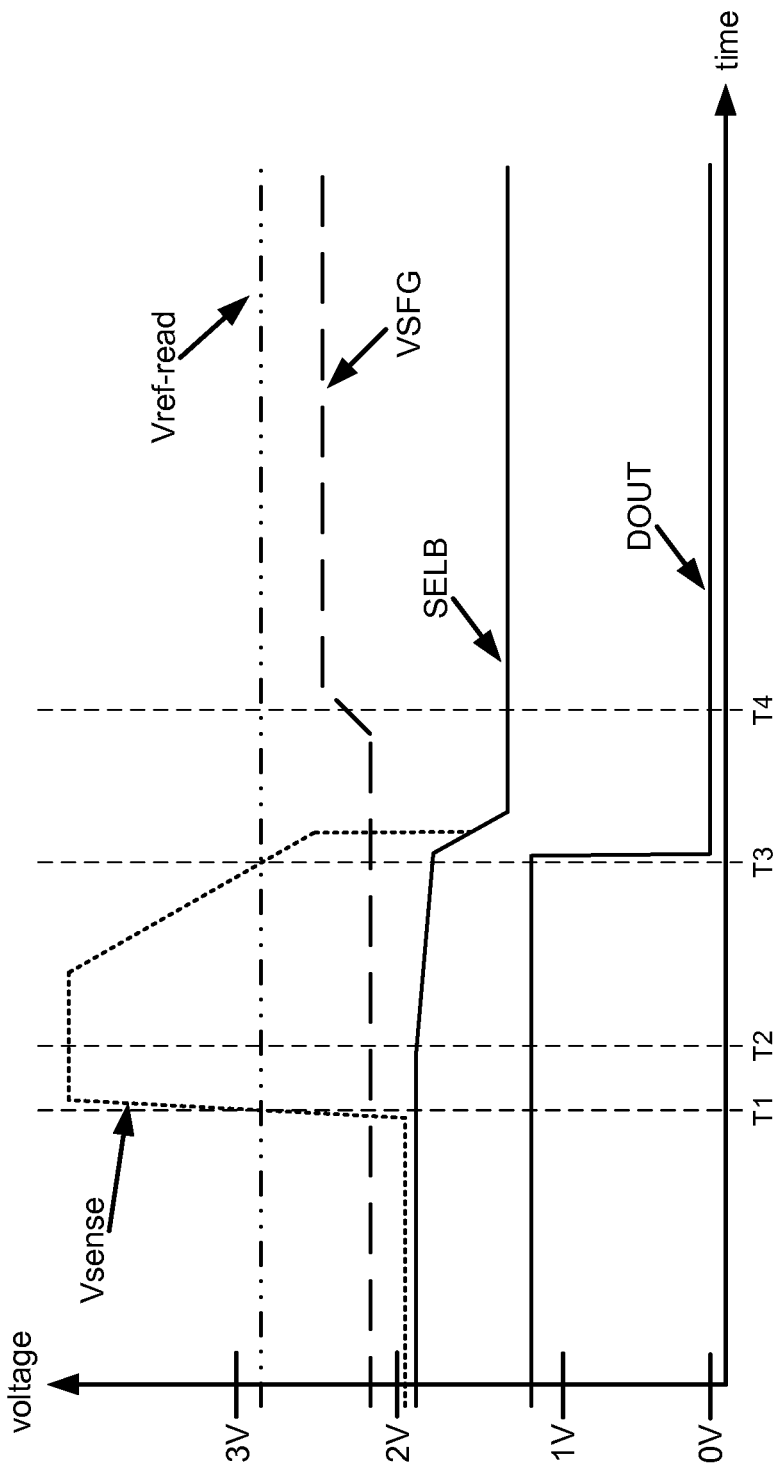
FIG. 8A depicts one embodiment of a smart read scheme for sensing a plurality of memory cells.

FIG. 8A depicts one embodiment of a smart read scheme for sensing a plurality of memory cells associated with a shared word line using the read/write circuit 770 of FIG. 7C. The signals Vsense, SELB, DOUT, VSFG, and Vref-read may correspond with the nodes described in FIG. 7C. As depicted, at time T1, the Vsense node is pre-charged to a voltage level (e.g., 3.8V) above the Vref-read voltage level (e.g., 2.8V). The voltage levels for Vref-read, VSFG, and SELB may be settled prior to time T1. The voltage of VSFG is set such that the SELB node is set to the selected bit line voltage during a read operation (e.g., 2V). At time T2, sensing commences and the SELB node begins to slowly discharge due to sensing current through a selected memory cell. It should be noted that the Vsense node does not immediately discharge as the source (SELB) of the transistor 786 in a source-follower configuration must discharge sufficiently in order for the source-follower to discharge the Vsense node. At time T3, the Vsense node has discharged to a voltage level that is less than Vref-read causing the output of sense amplifier 792 to trip (i.e., DOUT falls). After DOUT falls, the reference current charging the Vsense node may be disabled and the SELB node may be discharged to a lower voltage level than the selected bit line voltage during the read operation. In one embodiment, the SELB node may be discharged by 500 mV or set to an unselected bit line voltage. In another embodiment, the SELB node may be discharged through one or more diode connected nMOS devices in series. For example, the SELB node may be discharged to a voltage level corresponding with two transistor VTs above ground. Once the reference current to the Vsense node has been disabled and the SELB node has been discharged to a level that reduces the sensing current through a selected memory cell, the sense amplifier may be deemed to be in a locked-out state or locked-out from further sensing during the read operation. At time T4, the VSFG reference that is common to a group of sense amplifiers may be increased in order to increase the selected bit line voltage associated with sense amplifiers that have not been locked-out.

Figure 8B:
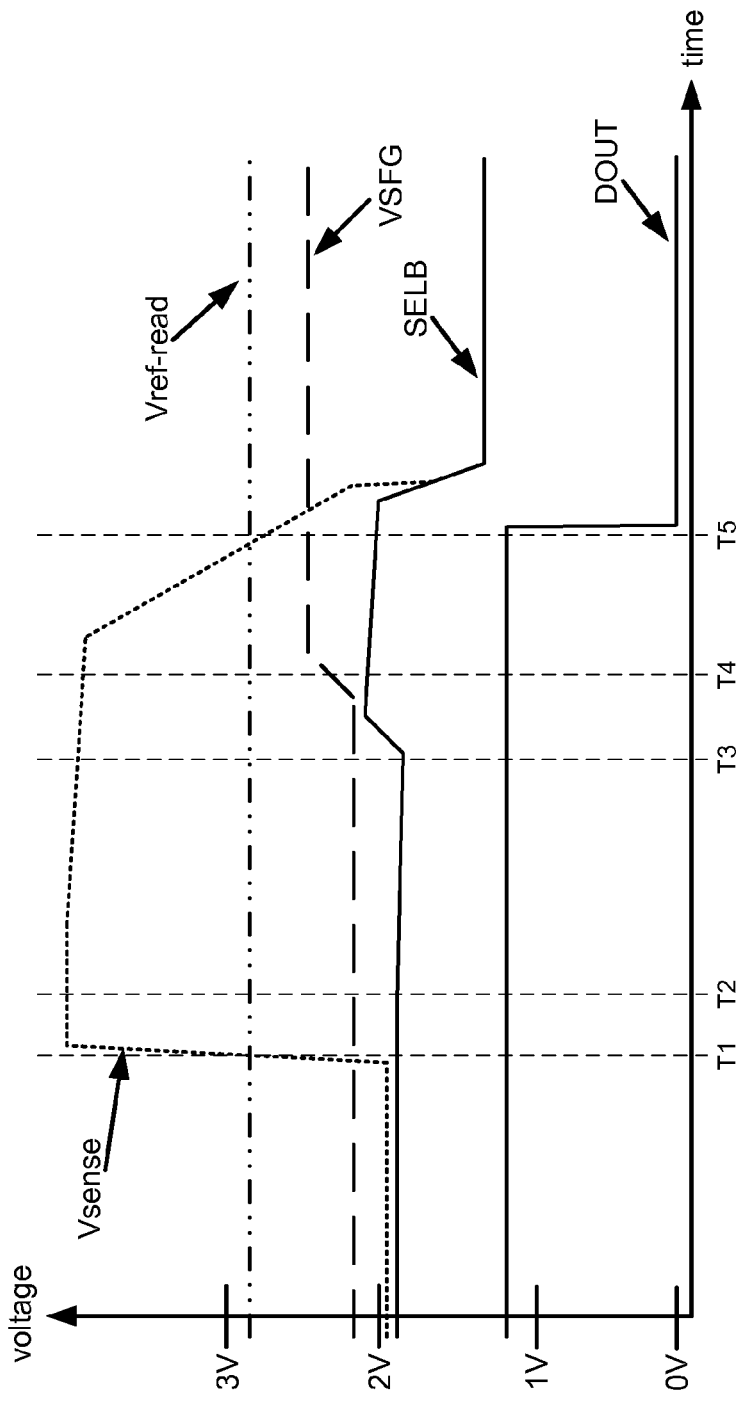
FIG. 8B depicts one embodiment of a smart read scheme for sensing a plurality of memory cells.

FIG. 8B depicts one embodiment of a smart read scheme for sensing a plurality of memory cells associated with a shared word line using the read/write circuit 770 of FIG. 7C. The signals Vsense, SELB, DOUT, VSFG, and Vref-read may correspond with the nodes described in FIG. 7C. As depicted, at time T1, the Vsense node is pre-charged to a voltage level (e.g., 3.8V) above the Vref-read voltage level (e.g., 2.8V). The voltage levels for Vref-read, VSFG, and SELB may be settled prior to time T1. The voltage of VSFG is set such that the SELB node is set to the selected bit line voltage during a read operation (e.g., 2V). At time T2, sensing commences and the SELB node begins to slowly discharge due to sensing current through a selected memory cell. At time T3, the voltage at the SELB node is increased in order to increase the selected bit line voltage applied to the selected memory cell. At time T4, the VSFG reference that is common to a group of sense amplifiers is increased corresponding with the increase to the selected bit line voltage. The delay between the SELB node rising at T3 and the VSFG node rising at T4 is to prevent charge on the Vsense node from being discharged in order to charge up the SELB node, which may lead to a false detection of the sensing current through a selected memory cell (i.e., the discharging of the Vsense node would be due to the charging up of the SELB node and not due to the sensing current through a selected memory cell). In some cases, the selected bit line voltage may be raised between 50 mV and 200 mV (e.g., raise by 150 mV).

With a higher selected bit line voltage applied to the selected memory cell, at time T5, the Vsense node has discharged to a voltage level that is less than Vref-read causing the output of sense amplifier 792 to trip (i.e., DOUT falls). After DOUT falls, the reference current charging the Vsense node may be disabled and the SELB node may be discharged to a lower voltage level than the selected bit line voltage during the read operation. In one embodiment, the SELB node may be discharged by 500 mV or set to an unselected bit line voltage. In another embodiment, the SELB node may be discharged through one or more diode connected nMOS devices in series. For example, the SELB node may be discharged to a voltage level corresponding with two transistor VTs above ground. Once the reference current to the Vsense node has been disabled and the SELB node has been discharged to a level that reduces the sensing current through a selected memory cell, the sense amplifier may be deemed to be in a locked-out state or locked-out from further sensing during the read operation.

Figure 9A:
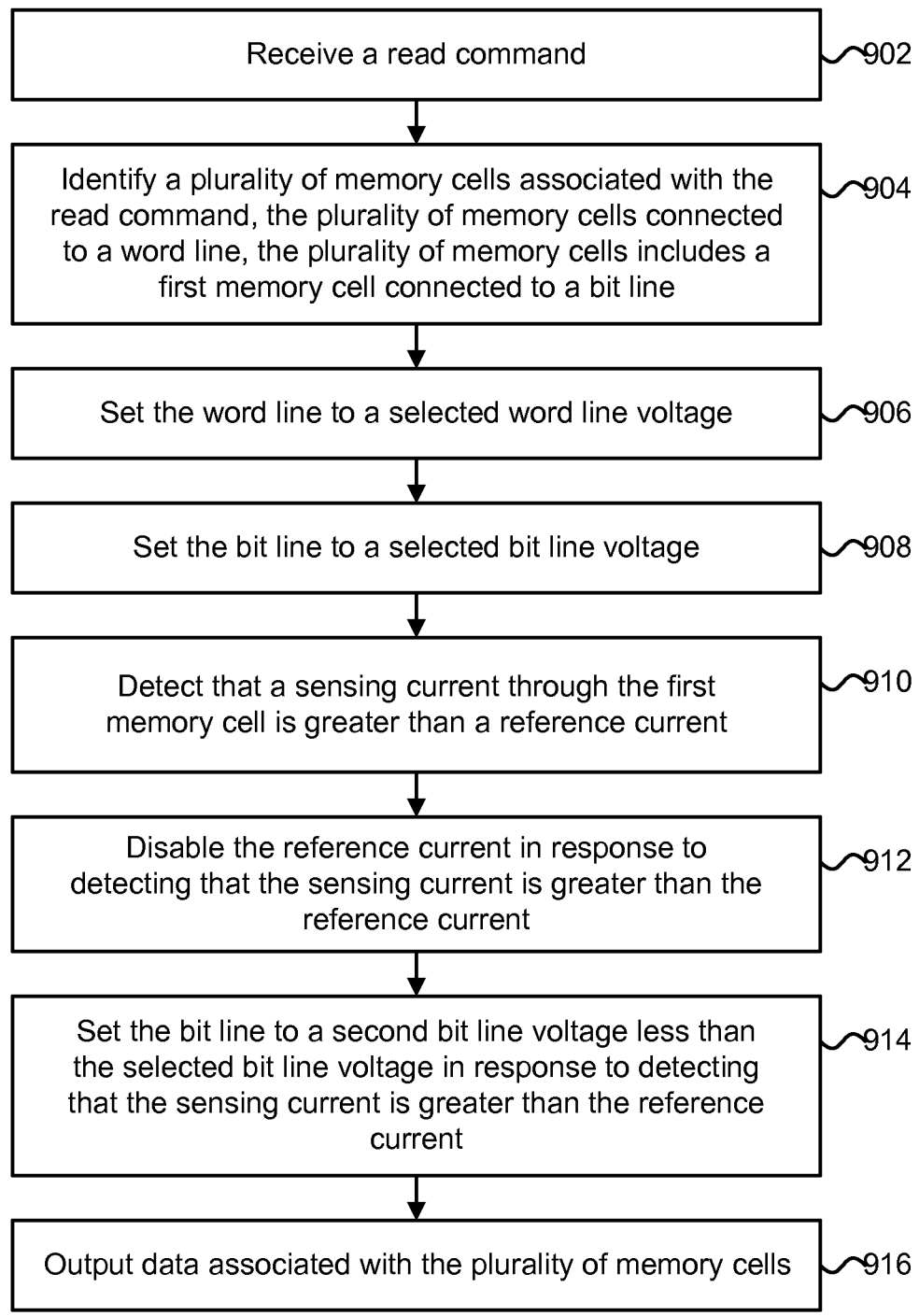
FIG. 9A is a flowchart describing one embodiment of a process for concurrently sensing a plurality of memory cells associated with a shared word line during a read operation.

FIG. 9A is a flowchart describing one embodiment of a process for concurrently sensing a plurality of memory cells associated with a shared word line during a read operation. In one embodiment, the process of FIG. 9A is performed by a memory chip, such as memory chip 102 in FIG. 1.

In step 902, a read command is received. In one embodiment, the read command may be received from a host to read one or more memory locations. In step 904, a plurality of memory cells associated with the read command is identified. The plurality of memory cells may be connected to a word line (e.g., a common word line shared by the plurality of memory cells). The plurality of memory cells may include a first memory cell connected to a bit line. In step 906, the word line is set to a selected word line voltage. In one embodiment, the word line may be set to 0V using a word line driver including a pulldown path to ground. In step 908, the bit line is set to a selected bit line voltage. In one embodiment, the bit line may be set to 2V.

In step 910, it is detected that the sensing current through the first memory cell is greater than a reference current. Detecting that the sensing current through the first memory cell is greater than the reference current may be used to determine a state of the first memory cell (e.g., that the first memory cell is in an ON state). In one embodiment, the sensing current through the first memory cell may be determined to be greater than the reference current by comparing the sensing current with the reference current. In some cases, a read/write circuit, such as read/write circuit 770 of FIG. 7C, may be used to detect that the sensing current through the first memory cell is greater than the reference current.

In step 912, the reference current is disabled (or turned-off) in response to detecting that the sensing current is greater than the reference current. In step 914, the bit line is set to a second bit line voltage less than the selected bit line voltage in response to detecting that the sensing current is greater than the reference current. In one embodiment, the bit line may be set by discharging a corresponding SELB node by 500 mV. The bit line may be set to the second bit line voltage using a switch (e.g., an nMOS device) controlled by DOUT that is connected to an unselected bit line voltage (e.g., a voltage for biasing unselected bit lines). In another embodiment, the bit line may be set by discharging a corresponding SELB node using one or more diode connected nMOS devices in series. For example, the SELB node may be discharged to a voltage level corresponding with one or more transistor VTs above ground. In step 916, data associated with the plurality of memory cells is outputted. The data may depend on the state of the first memory cell.

Figure 9B:
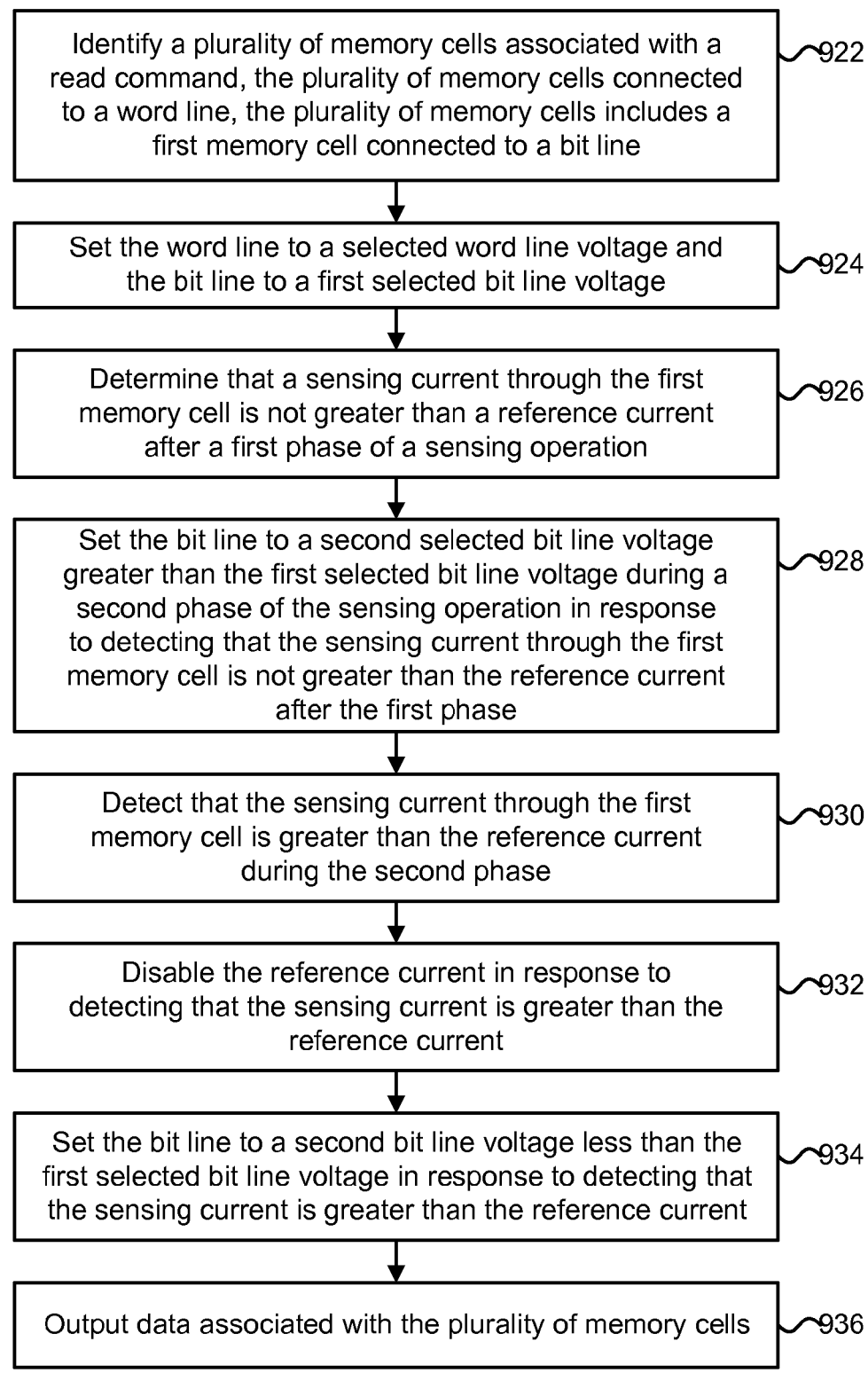
FIG. 9B is a flowchart describing one embodiment of a process for concurrently sensing a plurality of memory cells associated with a shared word line during a read operation.

FIG. 9B is a flowchart describing one embodiment of a process for concurrently sensing a plurality of memory cells associated with a shared word line during a read operation. In one embodiment, the process of FIG. 9B is performed by a memory chip, such as memory chip 102 in FIG. 1.

In step 922, a plurality of memory cells associated with a read command is identified. The plurality of memory cells may be connected to a word line (e.g., comprising a word line shared by the plurality of memory cells). The plurality of memory cells may include a first memory cell connected to a bit line. In step 924, the word line is set to a selected word line voltage and the bit line is set to a first selected bit line voltage (e.g., 2.0V). In step 926, it is determined that a sensing current to the first memory cell is not greater than a reference current after the first phase of a sensing operation. In one embodiment, the sensing current may be deemed to not be greater than the reference current if a sense amplifier in communication with the bit line does not output a change in state.

In step 928, the bit line is set to a second selected bit line voltage (e.g., 2.2V) greater than the first selected bit line voltage during a second phase of the sensing operation. The bit line may be set to the second selected bit line voltage in response to determining that the sensing current through the first memory cell is not greater than the reference current after the first phase. In some embodiments, the second phase of the sensing operation may begin after a particular period of time has passed or after a number of sense amplifiers have been disabled (or locked out). In one example, the second phase of the sensing operation may begin after five sense amplifiers have been locked-out.

In some embodiments, the bit line may be set to the second selected bit line voltage in response to detecting that a particular period of time has passed (e.g., after sensing the first memory cell for 50 ns) or after a number of sense amplifiers have been disabled (or locked out).

In step 930, it is detected that the sensing current to the first memory cell is greater than the reference current during the second phase. Detecting that the sensing current to the first memory cell is greater than the reference current may be used to determine a state of the first memory cell (e.g., that the first memory cell is in an ON state). In one embodiment, the sensing current through the first memory cell may be determined to be greater than the reference current by comparing the sensing current with the reference current. In some cases, a read/write circuit, such as read/write circuit 770 of FIG. 7C, may be used to detect that the sensing current through the first memory cell is greater than the reference current.

In step 932, the reference current is disabled (or turned-off) in response to detecting that the sensing current is greater than the reference current. In step 934, the bit line is set to a second bit line voltage (e.g., 1.5V) less than the first selected bit line voltage in response to detecting that the sensing current is greater than the reference current. In one embodiment, the bit line may be set by discharging a corresponding SELB node by 500 mV. In another embodiment, the bit line may be set by discharging a corresponding SELB node using one or more diode connected nMOS devices in series. For example, the SELB node may be discharged to a voltage level corresponding with one or more transistor VTs above ground. In step 936, data associated with the plurality of memory cells is outputted. The data may depend on the state of the first memory cell.

Figure 9C:
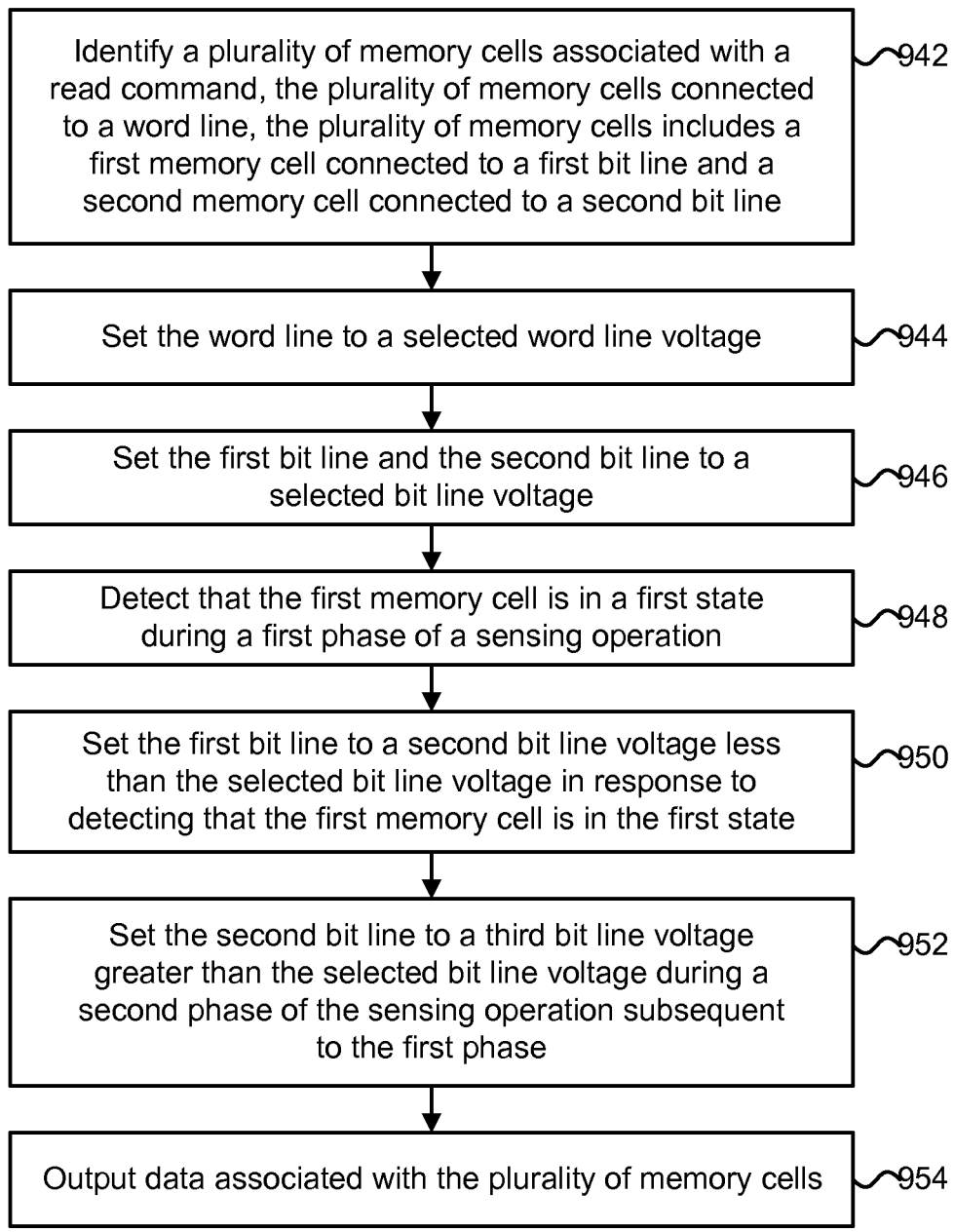
FIG. 9C is a flowchart describing an alternative embodiment of a process for concurrently sensing a plurality of memory cells associated with a shared word line during a read operation.

FIG. 9C is a flowchart describing an alternative embodiment of a process for concurrently sensing a plurality of memory cells associated with a shared word line during a read operation. In one embodiment, the process of FIG. 9C is performed by a memory chip, such as memory chip 102 in FIG. 1.

In step 942, a plurality of memory cells associated with a read command is identified. The plurality of memory cells may be connected to a word line (e.g., comprising a word line shared by the plurality of memory cells). The plurality of memory cells may include a first memory cell connected to a first bit line and a second memory cell connected to a second bit line. In step 944, the word line is set to a selected word line voltage. In step 946, the first bit line is set to a selected bit line voltage and the second bit line is set to the selected bit line voltage.

In step 948, it is detected that the first memory cell is in a first state during a first phase of a sensing operation. Detecting that the first memory cell is in the first state (e.g., that the first memory cell is in an ON state) may include detecting that a sensing current associated with the first memory cell is greater than a reference current. In one embodiment, the sensing current through the first memory cell may be determined to be greater than the reference current by comparing the sensing current with the reference current. In some cases, a read/write circuit, such as read/write circuit 770 of FIG. 7C, may be used to detect that the first memory cell is in the first state.

In step 950, the first bit line is set to a second bit line voltage less than the selected bit line voltage in response to detecting that the first memory cell is in the first state. In one embodiment, the bit line may be set by discharging a corresponding SELB node by 500 mV. In another embodiment, the bit line may be set by discharging a corresponding SELB node using one or more diode connected nMOS devices in series. For example, the SELB node may be discharged to a voltage level corresponding with one or more transistor VTs above ground.

In step 952, the second bit line is set to a third bit line voltage greater than the selected bit line voltage during a second phase of the sensing operation subsequent to the first phase. In one embodiment, the second bit line may be set by biasing a corresponding SELB node to the third bit line voltage. The third bit line voltage may be generated from a voltage regulator different from the voltage regulator for generating the selected bit line voltage. In some cases, a control signal (e.g., VSFG) to a source-follower transistor (e.g., transistor 786 in FIG. 7C) for clamping the SELB node to the third bit line voltage may be increased after the SELB node voltage has been increased. A delay between the SELB node rising and the control signal rising may be used to prevent charge on an internal sense node (e.g., the Vsense node in FIG. 7C) from being discharged in order to charge up the SELB node, which may lead to a false detection of the sensing current through a selected memory cell (i.e., the discharging of the Vsense node would be due to the charging up of the SELB node and not due to the sensing current through a selected memory cell). In some cases, the second bit line may be set to a voltage that is 200 mV greater than the selected bit line voltage.

In some embodiments, the second bit line may be set to the third bit line voltage greater than the selected bit line voltage in response to detecting that a particular period of time has passed (e.g., after sensing the first memory cell for 50 ns) or after a number of sense amplifiers have been disabled (or locked out). In one example, the second bit line may be set to the third bit line voltage greater than the selected bit line voltage in response to detecting that five sense amplifiers have been locked-out during the first phase of the sensing operation. In step 954, data associated with the plurality of memory cells is outputted. The data may depend on the state of the first memory cell.

One embodiment of the disclosed technology includes identifying a plurality of memory cells associated with a read operation. The plurality of memory cells connected to a word line. The plurality of memory cells includes a first memory cell connected to a bit line. The method further includes setting the word line to a selected word line voltage, setting the bit line to a selected bit line voltage, detecting that a sensing current through the first memory cell is greater than a reference current during the read operation, disabling the reference current in response to detecting that the sensing current is greater than the reference current, setting the bit line to a second bit line voltage less than the selected bit line voltage in response to detecting that the sensing current is greater than the reference current, and outputting data associated with the first memory cell.

One embodiment of the disclosed technology includes a plurality of memory cells including a first memory cell, a word line driver, and a memory cell sensing circuit in communication with the first memory cell. The plurality of memory cells is connected to a word line. The first memory cell is connected to a bit line. The word line driver sets the word line to a selected word line voltage. The memory cell sensing circuit sets the bit line to a selected bit line voltage and generates a reference current during a read operation. The memory cell sensing circuit detects that a sensing current through the first memory cell is greater than the reference current during the read operation. The memory cell sensing circuit disables the reference current in response to detecting that the sensing current is greater than the reference current and causes the bit line to be set to a second bit line voltage less than the selected bit line voltage in response to detecting that the sensing current is greater than the reference current.

One embodiment of the disclosed technology includes identifying a plurality of memory cells associated with a sensing operation. The plurality of memory cells connected to a word line. The plurality of memory cells includes a first memory cell connected to a bit line. The method further includes setting the word line to a selected word line voltage, setting the bit line to a first selected bit line voltage, determining that a sensing current through the first memory cell is not greater than a reference current after a first phase of the sensing operation, and setting the bit line to a second selected bit line voltage greater than the first selected bit line voltage during a second phase of the sensing operation subsequent to the first phase. The setting the bit line to a second selected bit line voltage is performed in response to determining that the sensing current through the first memory cell is not greater than the reference current after the first phase. The method further includes detecting that the sensing current to the first memory cell is greater than the reference current during the second phase of the sensing operation, disabling the reference current in response to detecting that the sensing current is greater than the reference current, setting the bit line to a second bit line voltage less than the first selected bit line voltage in response to detecting that the sensing current is greater than the reference current, and outputting data associated with the first memory cell.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a non-volatile storage system, comprising:
   identifying a plurality of memory cells associated with a read operation, the plurality of memory cells connected to a word line, the plurality of memory cells includes a first memory cell connected to a bit line;
   setting the word line to a selected word line voltage;
   setting the bit line to a selected bit line voltage;
   detecting that a sensing current through the first memory cell is greater than a reference current during the read operation;
   disabling the reference current in response to detecting that the sensing current is greater than the reference current;
   setting the bit line to a second bit line voltage less than the selected bit line voltage in response to detecting that the sensing current is greater than the reference current; and
   outputting data associated with the first memory cell.

2. The method of claim 1, further comprising:
   setting a second bit line connected to a second memory cell of the plurality of memory cells to a second selected bit line voltage greater than the selected bit line voltage subsequent to the setting the bit line to a second bit line voltage less than the selected bit line voltage.

3. The method of claim 2, wherein:
the setting the second bit line to the second selected bit line voltage greater than the selected bit line voltage is performed in response to determining that a number of sense amplifier lock-outs is greater than a threshold number of lock-outs.

4. The method of claim 2, wherein:
the setting the bit line to a second bit line voltage less than the selected bit line voltage is performed during a first phase of a sensing operation; and
the setting the second bit line to the second selected bit line voltage greater than the selected bit line voltage is performed during a second phase of the sensing operation subsequent to the first phase.

5. The method of claim 1, wherein:
the setting the bit line to a second bit line voltage less than the selected bit line voltage includes discharging the bit line using a discharge circuit.

6. The method of claim 1, wherein:
the setting the bit line to a second bit line voltage less than the selected bit line voltage includes discharging the bit line using one or more diode connected transistors in series.

7. The method of claim 1, wherein:
the disabling the reference current includes disabling a current mirror providing the reference current.

8. The method of claim 1, wherein:
the first memory cell comprises a two-terminal memory cell.

9. The method of claim 1, wherein:
the first memory cell includes a phase change material.

10. A non-volatile storage system, comprising:
a plurality of memory cells, the plurality of memory cells connected to a word line, the plurality of memory cells includes a first memory cell connected to a bit line;
a word line driver, the word line driver sets the word line to a selected word line voltage; and
a memory cell sensing circuit in communication with the first memory cell, the memory cell sensing circuit sets the bit line to a selected bit line voltage and generates a reference current during a read operation, the memory cell sensing circuit detects that a sensing current through the first memory cell is greater than the reference current during the read operation, the memory cell sensing circuit disables the reference current in response to detecting that the sensing current is greater than the reference current and causes the bit line to be set to a second bit line voltage less than the selected bit line voltage in response to detecting that the sensing current is greater than the reference current.

11. The non-volatile storage system of claim 10, wherein:
the memory cell sensing circuit causes the bit line to be set to the second bit line voltage by enabling a discharge circuit in response to detecting that the sensing current is greater than the reference current.

12. The non-volatile storage system of claim 11, wherein:
the discharge circuit includes one or more diode connected transistors in series.

13. The non-volatile storage system of claim 10, wherein:
the memory cell sensing circuit disables the reference current in response to detecting that the sensing current is greater than the reference current by disabling a current mirror providing the reference current.

14. The non-volatile storage system of claim 10, wherein:
the first memory cell comprises a two-terminal memory cell.

15. A method for operating a non-volatile storage system, comprising:
identifying a plurality of memory cells associated with a sensing operation, the plurality of memory cells connected to a word line, the plurality of memory cells includes a first memory cell connected to a bit line;
setting the word line to a selected word line voltage;
setting the bit line to a first selected bit line voltage;
determining that a sensing current through the first memory cell is not greater than a reference current after a first phase of the sensing operation;
setting the bit line to a second selected bit line voltage greater than the first selected bit line voltage during a second phase of the sensing operation subsequent to the first phase, the setting the bit line to a second selected bit line voltage is performed in response to determining that the sensing current through the first memory cell is not greater than the reference current after the first phase;
detecting that the sensing current to the first memory cell is greater than the reference current during the second phase of the sensing operation;
disabling the reference current in response to detecting that the sensing current is greater than the reference current;
setting the bit line to a second bit line voltage less than the first selected bit line voltage in response to detecting that the sensing current is greater than the reference current; and
outputting data associated with the first memory cell.

16. The method of claim 15, wherein:
the setting the bit line to a second bit line voltage less than the selected bit line voltage includes discharging the bit line using a discharge circuit.

17. The method of claim 15, wherein:
the setting the bit line to a second bit line voltage less than the selected bit line voltage includes discharging the bit line using one or more diode connected transistors in series.

18. The method of claim 15, further comprising:
determining that a first time period has passed since the first phase of the sensing operation began, the setting the bit line to a second selected bit line voltage greater than the first selected bit line voltage is performed in response to determining that the first time period has passed since the first phase of the sensing operation began.

19. The method of claim 15, further comprising:
determining a number of sense amplifier lock-outs during the first phase of the sensing operation, the setting the bit line to a second selected bit line voltage greater than the first selected bit line voltage is performed in response to determining that the number of sense amplifier lock-outs is greater than a threshold number of lock-outs.

20. The method of claim 15, wherein:
the setting the bit line to a second selected bit line voltage greater than the first selected bit line voltage includes increasing a control signal to a source-follower transistor used for clamping the bit line after the bit line has been set to the second selected bit line voltage.

* * * * *